United States Patent [19]

Hallford

[11] 4,399,562

[45] Aug. 16, 1983

[54] FULL BALUN MIXER

[75] Inventor: Ben R. Hallford, Wylie, Tex.

[73] Assignee: Rockwell International Corporation, El Segundo, Calif.

[21] Appl. No.: 286,406

[22] Filed: Jul. 24, 1981

[51] Int. Cl.³ .......................... H04B 1/26; H01P 5/10
[52] U.S. Cl. .................................... 455/327; 333/26; 455/330
[58] Field of Search ............................. 455/325–327, 455/330, 331; 333/26

[56] References Cited

U.S. PATENT DOCUMENTS

| 2,834,876 | 5/1958 | Pritchard et al. | |
|---|---|---|---|
| 3,652,941 | 3/1972 | Neuf . | |
| 3,678,433 | 7/1972 | Hallford . | |
| 3,681,697 | 8/1972 | Moroney . | |
| 3,818,385 | 6/1974 | Mouw | 455/326 |
| 3,831,097 | 8/1974 | Neuf . | |
| 4,186,352 | 1/1980 | Hallford | 333/26 |
| 4,240,052 | 12/1980 | Hallford | 333/202 |

OTHER PUBLICATIONS

George L. Matthaei, et al., "Microwave Filters, Impedance-Matching Networks, and Coupling Structures", McGraw-Hill, New York, 1964, pp. 809–812.
Julius Lange, "Interdigitated Strip–Line Quadrature Hybrid", *1969 International Microwave Symposium*, Dallas, Texas, May 5–7, IEEE Cat. No. 69 c 6, pp. 10–13.
Ben R. Hallford, "Trace Phase States to Check Mixer Designs", *Microwaves*, Jun. 1980, pp. 52–60.

*Primary Examiner*—Marc E. Bookbinder
*Attorney, Agent, or Firm*—Bruce C. Lutz; Michael E. Taken; Howard R. Greenberg

[57] ABSTRACT

Microwave circuit layout structure is disclosed for a diode mixer frequency converter. Each mixer port is provided by balun circuitry, and the diodes are isolated from, and on the opposite side of the substrate from, the primary circuits of the baluns. Single and double sideband versions are disclosed, including various combinations of dual and single baluns and porting structure.

16 Claims, 4 Drawing Figures

4,399,562

FULL BALUN MIXER

TECHNICAL FIELD

The invention relates to microwave diode mixers and associated circuitry for up and down conversion between high frequency signals (e.g. RF or LO in the 6 GHz range) and low frequency signals (e.g. IF in the 70 MHz range), and more particularly to the circuit layout structure supplying the ports for a diode mixer.

BACKGROUND AND SUMMARY

The present invention evolved from continuing development efforts pertaining to subject matter disclosed in my co-pending Application Ser. No. 265,128 filed May 19, 1981, entitled "Symmetric Microwave Mixer". This co-pending Application discloses a diode mixer with compact, symmetric conductor port structure significantly reducing unwanted sensitivity to adverse parameters.

The present invention relates to improvements in the microstrip circuit layout and structure in those applications where greater isolation is desired. Each port to the mixer diodes is provided by balun circuitry. The mixer diodes are connected solely to the secondary circuits of the baluns and are isolated from the primary circuits of the baluns.

In an exemplary down converter, a first balun supplies the RF port to the diode mixer, and one or two dual baluns supply the LO ports, for double or single sideband operation, respectively. Each dual balun has two pairs of balanced secondary conductors juxtaposed a primary conductor. The field between each secondary pair is applied across a separate diode of the mixer. The first conductors of the pairs are connected to a respective one of the balanced secondary conductors of the first RF balun and are separated by the same gap. The second conductors of the pairs are interconnected in common to a point between the diodes.

In a desirable aspect of the invention, coplanar diode mounting is achieved without sacrificing compactness or symmetry of the mixer port structure. This coplanar diode connection eliminates any need to extend one or more diode leads through the substrate. This latter type of through-lead connection may be cost objectionable in certain applications. The microstrip circuit layout of the present invention does not require holes in the substrate to complete the mixer circuit or to mount the diodes.

In another desirable aspect of the invention, IF voltages are not present on the RF or LO conductors, whereby to eliminate the need for filters to remove IF signals from the RF or LO signals. The IF voltages are also removed at a low RF potential point obviating the need to remove RF from the IF voltages and vice versa.

DETAILED DESCRIPTION

Figure 1:
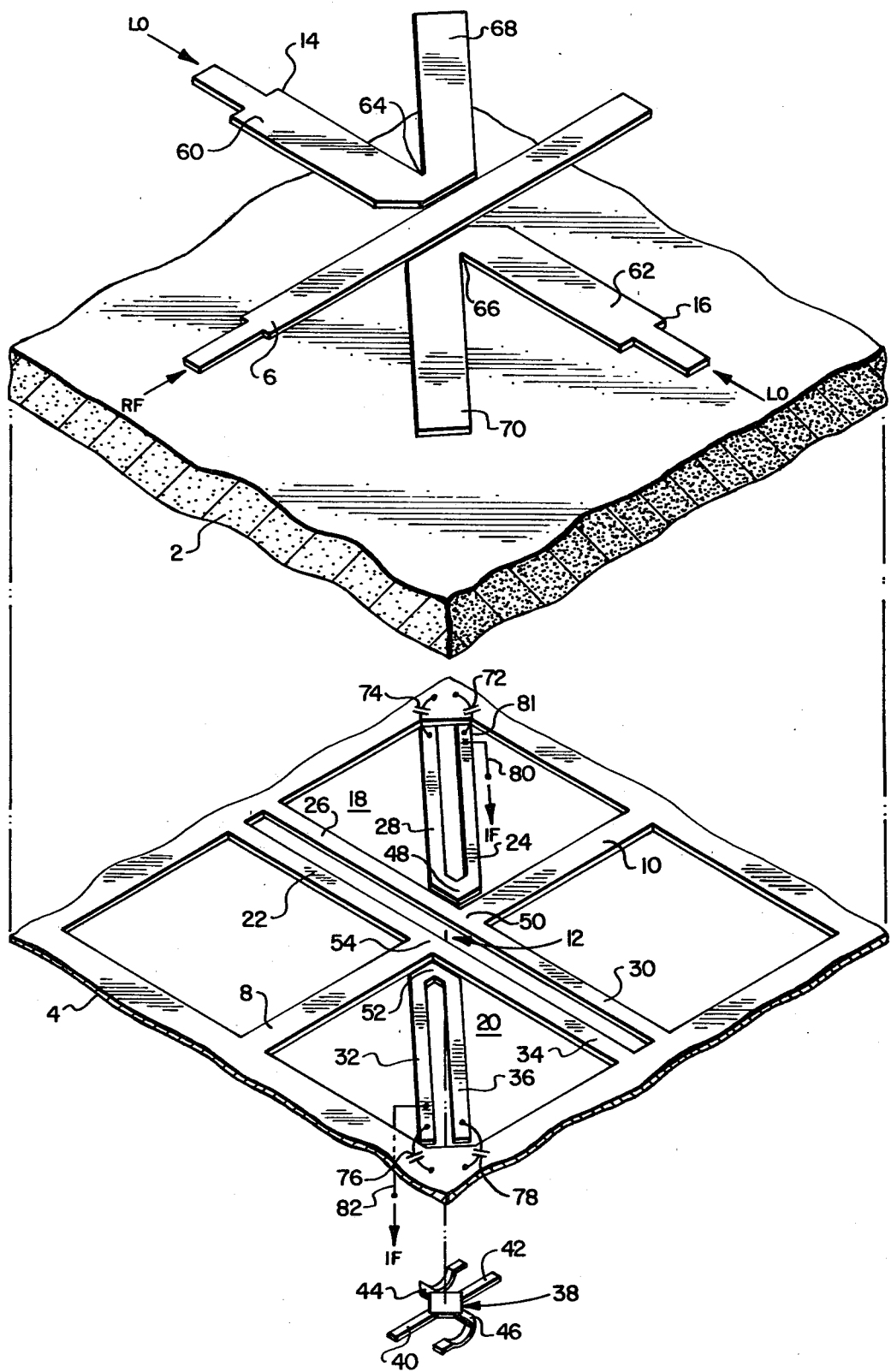
FIG. 1 is an exploded isometric view of microstrip circuit layout and structure constructed in accordance with the invention supplying the ports for a diode quad mixer.
Figure 2:
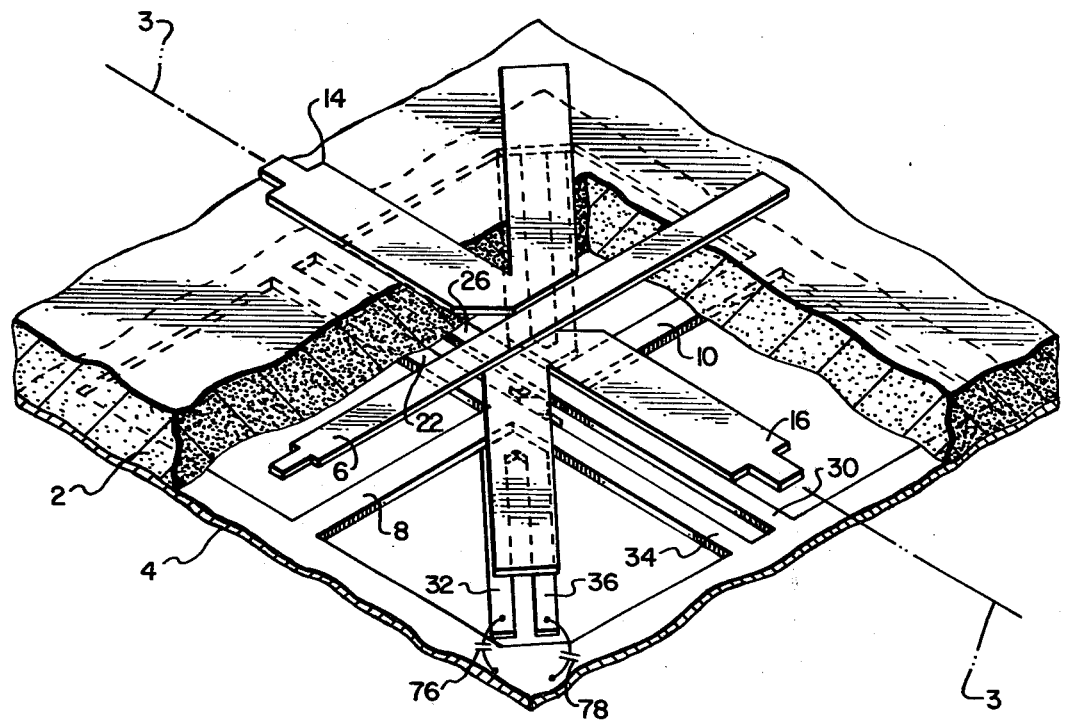
FIG. 2 is an assembly view of the circuit layout and structure of FIG. 1.

FIGS. 1 and 2 show microstrip circuit layout structure constructed in accordance with the invention for a microwave mixer frequency converter. A planar dielectric substrate 2 has a ground plane 4 on the bottomside thereof. A first primary conductor 6 is on the topside of substrate 2. First and second secondary conductors 8 and 10 are on the bottomside of substrate 2 and extend from ground plane 4 towards each other to a separation gap 12 therebetween. First and second secondary conductors 8 and 10 are juxtaposed below the first primary conductor 6 for interacting therewith to balun couple a field balanced between first and second secondary conductors 8 and 10 across gap 12.

Second and third primary conductors 14 and 16 are on the topside of substrate 2. Secondary conductor means are provided on the bottomside of substrate 2 for the second and third primary conductors 14 and 16 to interact therewith for balun field coupling. This secondary conductor means comprises two dual balun secondary conductor pairs 18 and 20, with dual balun secondary conductor pair 18 juxtaposed below second primary conductor 14, and the other dual balun secondary conductor pair 20 juxtaposed below the third primary conductor 16. Dual balun second conductor pair 18 comprises two pairs of balanced secondary conductors 22 and 24, and 26 and 28. The other dual balun secondary conductor pair 20 comprises two pairs of balanced secondary conductors 30 and 32, and 34 and 36.

Figure 3:
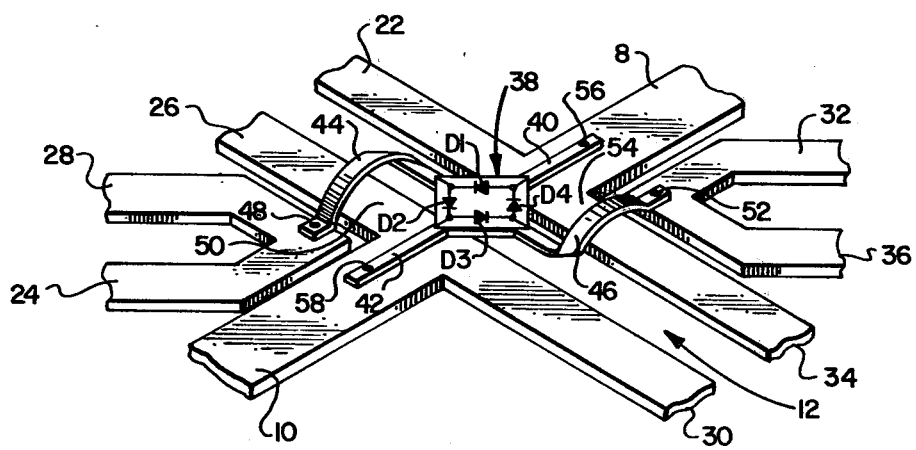
FIG. 3 is an isolated, enlarged view of the central portion of the bottomside of the structure of FIG. 2 rotated 180° about axis 3—3.

A diode quad mixer 38 is on the bottomside of substrate 2 isolated from the first, second and third primary conductors 6, 14 and 16, respectively. Diode quad mixer 38 is coplanarly interconnected between the first and second secondary conductors 8 and 10 and said secondary conductor means, comprised of dual balun 18 and dual balun 20, for heterodyne modulation product signal generation. FIG. 3 shows the connection of diode mixer bridge 38. This mixer has a diode quad ring, and the diodes are schematically illustrated. The diodes have opposite leads 40 and 42 ohmically connected to conductors 8 and 10. The remaining two opposite diode leads 44 and 46 are ohmically connected to designated portions of dual balun secondary conductor pairs 18 and 20, respectively. Diode lead 44 is connected at a common interconnection point 48 to secondary conductors 24 and 28. Lead 44 is jumpered over and ohmically isolated from the junction 50 of conductors 10 and 26. Diode lead 46 is connected at a common interconnection point 52 to secondary conductors 32 and 36. Lead 46 is jumpered over and ohmically isolated from the junction 54 of secondary conductors 8 and 34.

The field induced from primary conductor 14 between secondary conductor pair 22 and 24 is applied across diode D1. The field induced from primary conductor 14 between the other pair of secondary conductors 26 and 28 of dual balun secondary conductor pair 18 is applied across diode D2. The field induced from third primary conductor 16 between the first pair of balanced secondary conductors 30 and 32 of second dual balun secondary conductor pair 20 is applied across diode D3. The field induced from third primary conductor 16 across the other secondary conductor pair 34 and 36 of dual balun secondary conductor pair 20 is applied across diode D4.

The first conductors 22 and 26 in the two pairs of balanced secondary conductors of dual balun secondary conductor pair 18 extend in spaced parallel relation from ground plane 4 to a respective one of first and second secondary conductors 8 and 10, and are separated by the same gap 12, FIG. 1. The second conductors 24 and 28 in the pairs of dual balun secondary conductor pair 18 extend in spaced parallel relation and are connected in common to a point 48 between diodes D1 and D2. The first conductors 30 and 34 in the two pairs of balanced secondary conductors of the other dual balun secondary conductor pair 20 extend in spaced parallel relation from ground plane 4 to a respective one of the first and second secondary conductors 8 and 10, and are separated by the same gap 12. The second conductors 32 and 36 in the two pairs of balanced secondary conductors of dual balun secondary conductor pair 20 extend in spaced parallel relation and are connected in common to a point 52 between diodes D3 and D4. First secondary conductor 8 is connected to a point 56, FIG. 3, between diodes D4 and D1. Second secondary conductor 10 is connected to a point 58 between diodes D2 and D3.

Second primary conductor 14 and dual balun secondary conductor pair 18 have a generally V-shaped configuration with one leg 60 extending perpendicularly to the first primary conductor 6 and the first and second secondary conductors 8 and 10. The third primary conductor 16 and the other dual balun 20 also have a generally V-shaped configuration with one leg 62 extending perpendicularly to the first primary conductor 6 and the first and second secondary conductors 8 and 10. The yokes 64 and 66 of each V-shape are proximate the diode quad mixer 38 and extend oppositely away therefrom. The other legs 68 and 70 extend at a 45° angle from their mating leg.

The first conductors 22 and 26 in the two pairs of balanced secondary conductors of dual balun secondary conductor pair 18 form the correspondent one leg 60 of balun secondary conductor pair 18. The second conductors 24 and 28 in the pairs form the other correspondent leg 68 of balun secondary conductor pair 18. However, common interconnection point 48 is gapped from junction 50. The first conductors 30 and 34 in the two pairs of balanced secondary conductors of the other dual balun secondary conductor pair 20 form the correspondent one leg 62 of balun 20. The second conductors 32 and 36 of the pairs form the other correspondent leg 70 of balun secondary conductor pair 20. Common interconnection point 52 is gapped from junction 54.

Second conductors 24 and 28 in the pairs of dual balun 18 extend from their common interconnection point 48 and terminate proximate but gapped from ground plane 4. Conductors 24 and 28 are connected to the ground plane by bandpass capacitor filter means, such as capacitors 72 and 74 having a low impedance to RF and a high impedance to IF. An alternative is a common interconnection between the outer tips of conductors 24 and 28 and a single capacitor connection therefrom to ground plane 4. Second conductors 32 and 36 in the pairs of dual balun 20 extend from their common interconnection point 52 outwardly and terminate proximate but gapped from ground plane 4. Conductors 32 and 36 are connected to the ground plane by RF bandpass, IF rejection, capacitor filter means, such as capacitors 76 and 78.

When implemented as a down converter, an RF signal is input at port 6 and quadrature LO signals are input at ports 14 and 16. The RF signal is coupled from topside primary conductor 6 to bottomside secondary conductors 8 and 10 to provide the field existing across gap 12 between balanced first and second secondary conductors 8 and 10. Conductors 8 and 10 thus provide a balanced input port to diode mixer bridge 38 at points 56 and 58. The LO signal on topside primary conductor 14 is coupled to the first bottomside secondary conductor pair 22 and 24 and to the second bottomside secondary conductor pair 26 and 28 of dual balun secondary conductor pair 18. The LO signal on topside primary conductor 16 is coupled to the first bottomside secondary conductor pair 30 and 32 and to the second bottomside secondary conductor pair 34 and 36 of dual balun secondary conductor pair 20.

Diode mixer bridge 38 receives the RF and LO signals and outputs a plurality of frequencies, including an IF signal at a frequency which is the difference between the RF and LO signal frequencies. The frequencies which are output from mixer 38 are the modulation products which exist according to the heterodyne principle by which the mixer operates, wherein an RF signal and an LO signal are applied to a non-linear element, such as a diode. The RF and LO signals are mixed in the diode quad 38 to generate the various modulated frequencies, including IF signals on conductors 24 and 28, and 32 and 36. These IF signals may be tapped by means of a bus wire link 80 or the like connected to either one or both of conductors 24 and 28, which link may extend downwardly as shown in FIG. 1 for external circuit connection or which may extend upwardly through substrate 2 for external circuit connection if more convenient in the particular application. A bus wire link 82 or the like is likewise connected to either one or both of conductors 32 and 36. An alternative to the bus wire link is an extension of one of the conductors, e.g. conductor 32, through a cut-out slotted or gapped section of ground plane 4 for external circuit connection to this conductor extension, as described more fully in conjunction with FIG. 4.

The IF signals may be passed through IF bandpass filters, for example as described in my U.S. Pat. No. 3,678,433, issued July 18, 1972, entitled "RF Rejection Filter". The outputs of such filters may, for example, be connected to a 90° quadrature hybrid 3 dB coupler, for example as shown in U.S. Pat. No. 3,831,097 to Neuf. The IF bandpass filters are not necessary because the IF voltages are removed at low RF potential points, e.g. 81, and thus there is no need to remove RF from the IF voltages. The LO signals supplied to conductors 14 and 16 may be passed through a branchline coupler, such as described in "Microwave Filters, Impedance-Matching Networks, and Coupling Structures", George L. Mattaei, et al., McGraw-Hill, New York, 1964, pp. 809–812, or through an interdigitated strip Lange-type coupler, for example as described in "Interdigitated Strip-Line Quadrature Hybrid", Julius Lange, 1969 *International Microwave Symposium*, Dallas, Texas, May 5–7, IEEE Cat. No. 69 c 6, pp. 10–13.

A desirable feature of the invention is that it eliminates the need for IF rejection filtering of the LO signals supplied to conductors 14 and 16. Such filtering is necessary in circuit structures where the IF signals appear on the LO signal conductors. In these circuits, the LO signals supplied to conductors such as 14 and 16 are passed through IF rejection capacitors or filters, i.e., LO bandpass filters, such as shown in my U.S. Pat. No. 4,240,052, issued Dec. 16, 1980, entitled "Balun Filter Apparatus". In the present invention, the mixer diodes are isolated from the primary circuits of the baluns and are connected solely to the secondary circuits of the baluns. Since the diode quad mixer 38 is not connected to any of the primary conductors 6, 14 or 16, low frequency IF voltages are not present on the RF or LO conductors, whereby to eliminate the need for filters to remove IF signals from the RF or LO signals.

When implemented as an up converter, LO signals are applied at ports 14 and 16 and IF signals are applied at ports 80 and 82, to generate an output RF signal at port 6. In this latter implementation, the RF signal is induced on topside conductor 6 from bottomside conductors 8 and 10 acting as primaries. In other applications, for both up and down converters, the RF and LO signals are transposed.

As is known in the art, a diode quad mixer generates a signal which is the image of the RF signal but on the opposite frequency side of the LO signal. For instance, a mixer receiving a 6 GHz (6,000 MHz) input RF signal and a 5,930 MHz input LO signal would generate a 70 MHz IF signal and a 5,860 MHz image RF signal. Typically about half of the incoming RF power is used in generating this image frequency signal. The loss in converting an incoming RF signal to an IF signal is thus significantly increased by this image frequency generation. For further background regarding mixer operation, reference is made to my article entitled "Trace Phase States to Check Mixer Designs", *Microwaves*, June, 1980, pp. 52-60.

Prior art devices have eliminated the image frequency signal in a variety of ways. Some devices use filters to prevent the image signal from entering the input signal circuitry, but this still results in an energy loss to the system, and also reduced bandwidth. Some devices provide an open or short circuit at the diodes in order to recover, or reduce the loss of, the image frequency energy. U.S. Pat. Nos. 2,834,876 and 3,681,697 show image recovery mixers where the image frequency power is reflected back to the mixer to provide recovery of the image frequency energy. Another technique is the use of a diode quad bridge, for example U.S. Pat. Nos. 3,831,097 and 3,652,941 to Neuf, for cancelling the image frequency within the mixer by circulating the image current in the diode quad only. This returns the image frequency power to the diodes, thus reducing conversion loss.

The structure of FIGS. 1-3 provides efficient frequency conversion and minimum loss. The structure enables single connection points on each of the respective connecting conductors for the diode mixer bridge. This minimizes distortion and unwanted phase shift, which otherwise degrades conversion efficiency. Secondary RF conductor point 56 provides a single common connection point for diodes D4 and D1; secondary LO conductor point 48 provides a single common connection point for diodes D1 and D2; secondary RF conductor point 58 provides a single common connection point for diodes D2 and D3; and secondary LO conductor point 52 provides a single common connection point for diodes D3 and D4. These common connection points for the respective diodes provide precise 180° phase differential between the diode pairs for generated image frequency, and a net image voltage of zero, thus reducing conversion loss. In the absence of these single point connections between the diode pairs, there would be a finite traversal distance for the image current on one or more of the conductors and this would cause a phase shift such that the image frequency phase in one diode pair would be other than 180° out of phase with the image frequency phase in the other diode pair.

In a desirable aspect of the invention, the circuit layout structure is fabricated using standard printed circuit board techniques. A simple off-the-shelf dielectric substrate which is copper clad on both sides is used. The copper is merely etched away to yield the conductor patterns shown.

In another advantageous aspect of the invention, the circuit layout and structure provides desirable microstrip transmission characteristics, as opposed to slotline and the like transmission characteristics and their attendant constraints. These constraints include various limitations on the dimensions of the slot, minimum ground plane spacing on either side of the slot, requisite high dielectric constant substrate, transmission mode waveguide problems, etc.

The present invention is implementable on a low dielectric constant substrate, for example in the range 2 to 5. While a high dielectric constant substrate may of course be used, the use of a low dielectric constant substrate is preferred in order to reduce cost.

The preferred dimensions of the conductor widths and gap widths are easily and cost efficiently implementable with standard printed circuit board techniques. For a typical 6 GHz mixer, the width of gap 12 is 36 mils, and the width of the gaps between conductors 24 and 28 and between 32 and 36 is also 36 mils. The width of conductors 22, 26, 30, 34, 24, 28, 32 and 36 is 36 mils. The width of topside conductor 14 at leg 60 is 108 mils, which is also the width of conductor legs 68, 62 and 70. The width of bottomside conductors 8 and 10 and of topside conductor 6 is 60 mils. The combined length of conductors 22 and 34 is 685 mils, and the combined length of conductors 8 and 10 and of gap 12 is also 685 mils. Substrate 2 has a dielectric constant of 2.17 and a thickness of 15 mils.

Though not a constraint of the invention, the above noted parameters are significant, particularly the gap width and dielectric constant. The structure of FIGS. 1-3 affords relatively large dimensions which are easy to implement and cost efficient in manufacture.

The circuit structure and layout provides highly desirable isolation of signals. The diodes are isolated from the primary circuits 6, 14 and 16 of the baluns. This isolation affords substantial immunity to various degrading influences and adverse parameters. Another benefit of this isolation, as above noted, is that IF voltages are not present on the RF frequency conductors, and this eliminates the need for filters to remove IF from the RF. In an alternative diode arrangement for even higher isolation, the polarity of diodes D1 and D2 is reversed.

Figure 4:
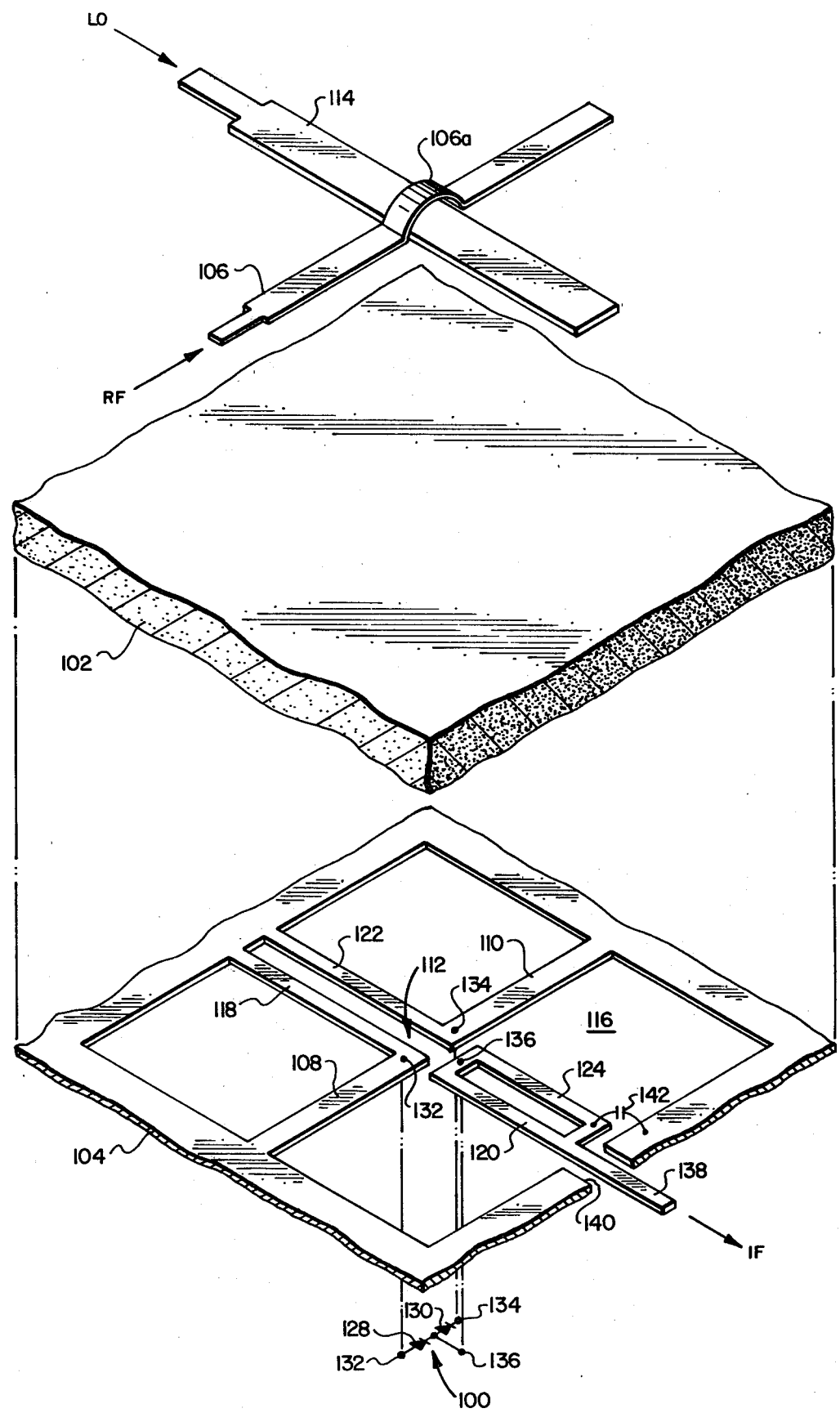
FIG. 4 is an exploded isometric view of an alternate embodiment of FIG. 1, showing microstrip circuit layout and structure constructed in accordance with the invention supplying the ports for a diode pair mixer.

FIG. 4 shows an alternative structure to that shown in FIG. 1. A diode pair mixer 100 is provided instead of the diode quad mixer 38 of FIG. 1, and the third primary conductor 16 and the other dual balun 20 of FIG. 1 are eliminated. The other leg 68 of primary conductor 14 is effectively folded over to be collinear with leg 60 and extend across conductor 6. The other leg of dual balun 18 formed by conductors 24 and 28 is likewise folded over to be collinear with conductors 22 and 26 but on the other side of the diode mixer.

Referring to FIG. 4, dielectric substrate 102 has a ground plane 104 on the bottomside thereof and a first primary conductor 106 on the topside. First and second secondary conductors 108 and 110 are on the bottomside of substrate 2 and extend from ground plane 104 towards each other to a separation gap 112 therebetween. Bottomside secondary conductors 108 and 110 are juxtaposed below the topside primary conductor 106 for interacting therewith of balun couple a field balanced between conductors 108 and 110 across gap 112. A second primary conductor 114 is on the topside of substrate 2 and extends orthogonally across and coplanar with first primary conductor 106. One or the other of primary conductors 106 and 114 has a jumper section over and ohmically separated from the other conductor, such as jumper section 106a in primary conductor 106 jumpered over the second primary conductor 114.

Secondary conductor means are provided on the bottomside of substrate 2 for the second primary conductor 114 to interact therewith for balun field coupling. This secondary conductor means comprises a dual balun 116 having two pairs of balanced secondary conductors 118 and 120, and 122 and 124. Diode pair mixer 100 is on the bottomside of substrate 2 isolated from first and second primary conductors 106 and 114 and coplanarly interconnecting the first and second secondary conductors 108 and 110 and the secondary conductor means provided by dual balun 116 for heterodyne modulation product signal generation.

This mixer has a pair of diodes 128 and 130 connected in series between bottomside secondary conductors 108 and 110 at points 132 and 134, respectively. The first conductors 118 and 122 in the pairs of balanced secondary conductors of the dual balun extend in spaced parallel relation from ground plane 4 to a respective one of the first and second secondary conductors 108 and 110 and are separated by the same gap 112. The second conductors 120 and 124 in the pairs of balanced conductors of the dual balun extend in spaced parallel relation and are connected in common at point 136 to a point between the diodes. Bottomside secondary conductors 122 and 124 are collinear, and bottomside secondary conductors 118 and 120 are collinear. The induced field between secondary conductor pair 118 and 120 is applied across diode 128. The induced field between the other secondary conductor pair 122 and 124 is applied across diode 130.

When implemented as a down converter, an RF signal is input at port 106 and an LO signal is input at port 114. The RF signal is coupled from topside primary conductor 106 to bottomside secondary conductors 108 and 110 to provide the field existing across gap 112 between balanced first and second secondary conductors 108 and 110. The LO signal on topside primary conductor 114 is coupled to bottomside secondary conductor pair 118 and 120 and to the other bottomside secondary conductor pair 122 and 124 of dual balun 116. The resultant modulated IF signal may be tapped-off as in FIG. 1, or an extension 138 of either or both of conductors 120 and 124 may be provided through an opening 140 in ground plane 104. An RF bandpass, IF rejection, capacitor 142 is connected between ground plane 104 and a common connection of conductors 120 and 124.

When implemented as an up converter, LO signals are applied at port 114 and IF signals are applied at port 138, to generate an output RF signal at port 106. In this latter implementation, the RF signal is induced on topside conductor 106 from bottomside conductors 108 and 110 acting as primaries. In other applications, for both up and down converters, the RF and LO signals are transposed.

It is recognized that various modifications are possible within the scope of the appended claims.

I claim:

1. A full balun mixer comprising:
   a dielectric substrate;
   first primary conductor means on the topside of said substrate;
   first secondary conductor means on the bottomside of said substrate juxtaposed below said first primary conductor means to interact therewith for balun field coupling;
   second primary conductor means on the topside of said substrate;
   second secondary conductor means comprising a dual balun including two pairs of balanced secondary conductors on the bottomside of said substrate juxtaposed below a common said second primary conductor means to interact therewith for balun field coupling; and
   a diode mixer on the bottomside of said substrate isolated from both said primary conductor means and interconnecting said first and second secondary conductor means for heterodyne modulation product signal generation, the field between each secondary pair applied across a separate diode of said mixer wherein said diode mixer includes a pair of diodes connected in series between balanced conductors of said first secondary conductor means, and wherein one conductor of each of said two pairs of balanced secondary conductors of said second secondary conductor means are connected in common to a point between said diodes.

2. The invention according to claim 1 wherein:
   the balanced conductors of said first secondary conductor means are separated by a first gap;
   the first conductor of each of said two pairs of balanced secondary conductors of said second secondary conductor means are separated by said first gap;
   the second conductor of each of said two pairs of balanced secondary conductors of said second secondary conductor means are interconnected in common to said point between said diodes.

3. The invention according to claim 2 wherein said first conductor of each of said two pairs of balanced secondary conductors of said second secondary conductor means are each connected to a respective one of said balanced conductors of said first secondary conductor means.

4. Balun coupled microwave mixer circuit layout and structure comprising:
   a dielectric substrate;
   ground plane means on the bottomside of said substrate;
   a first primary conductor on the topside of said substrate;
   first and second secondary conductors on the bottomside of said substrate extending from said ground plane means towards each other to a separation gap therebetween and juxtaposed below said first primary conductor for interacting therewith to balun couple a field balanced between said first and second secondary conductors across said gap;
   second and third primary conductors on the topside of said substrate;

secondary conductor means on the bottomside of said substrate for said second and third primary conductors to interact therewith for balun field coupling; and a diode quad mixer on the bottomside of said substrate isolated from said first, second and third primary conductors and interconnecting said first and second secondary conductors and said secondary conductor means for heterodyne modulation product signal generation.

5. The invention according to claim 4 wherein said secondary conductor means comprises two dual baluns, one dual balun juxtaposed below said second primary conductor, and the other dual balun juxtaposed below said third primary conductor.

6. The invention according to claim 5 wherein:
said one dual balun comprises two pairs of balanced secondary conductors, the field between one pair applied across a first of said diodes and the field between the other pair applied across a second of said diodes; and
said other dual balun comprises two pairs of balanced secondary conductors, the field between one pair applied across a third of said diodes and the field between the other pair applied across a fourth of said diodes.

7. The invention according to claim 6 wherein:
the first conductors in said pairs of said one dual balun extend in spaced parallel relation from said ground plane means to a respective one of said first and second secondary conductors, and are separated by the same said first mentioned gap;
the second conductors in said pairs of said one dual balun extend in spaced parallel relation and are connected in common to a point between said first and second diodes;
the first conductors in said pairs of said other dual balun extend in spaced parallel relation from said ground plane means to a respective one of said first and second secondary conductors and are separated by the same said first mentioned gap;
the second conductors in said pairs of said other dual balun extend in spaced parallel relation and are connected in common to a point between said third and fourth diodes;
said first secondary conductor is connected to a point between said fourth and first diodes; and
said second secondary conductor is connected to a point between said second and third diodes.

8. The invention according to claim 7 wherein:
said second primary conductor and one dual balun have a generally V-shaped configuration with one leg extending perpendicularly to said first primary conductor and first and second secondary conductors;
said third primary conductor and other dual balun have a generally V-shaped configuration with one leg extending perpendicularly to said first primary conductor and said first and second secondary conductors; and
the yokes of each said V-shape are proximate said diode quad mixer and extend oppositely away therefrom.

9. The invention according to claim 8 wherein:
said first conductors in said pairs of said one dual balun form said one leg of said first v-shape;
said second conductors in said pairs of said one dual balun form the other leg of said first V-shape and have a common interconnection point gapped from the junction of said second secondary conductor and one of said first conductors in said pairs of said one dual balun, said common interconnection point connected to said point between said first and second diodes by a jumper lead over and ohmically isolated from said junction;
said first conductors in said pairs of said other dual balun form said one leg of said second V-shape; and
said second conductors in said pairs of said other dual balun form the other leg of said second V-shape and have a common interconnection point gapped from the junction of said first secondary conductor and one of said first conductors in said pairs of said other dual balun, said last mentioned common interconnection point connected to said point between said third and fourth diodes by a jumper lead over and ohmically isolated from said last mentioned junction.

10. The invention according to claim 9 wherein:
said one legs of said first and second V-shapes extend oppositely collinearly away from said proximate yokes; and
said other legs of said first and second V-shapes extend oppositely away from said proximate yokes.

11. The invention according to claim 10 wherein:
said second conductors in said pairs of said one dual balun forming said other leg of said first V-shape extend from their said common interconnection point and terminate proximate but gapped from said ground plane means and are connected to said ground plane means by bandpass capacitor filter means; and
said second conductors in said pairs of said other dual balun forming said other leg of said second V-shape extend from their said common interconnection point and terminate proximate but gapped from said ground plane means and are connected to said ground plane means by second bandpass capacitor filter means.

12. Balun coupled microwave mixer circuit layout and structure comprising:
a dielectric substrate;
ground plane means on the bottomside of said substrate;
a first primary conductor on the topside of said substrate;
first and second secondary conductors on the bottomside of said substrate extending from said ground plane means towards each other to a separation gap therebetween and juxtaposed below said first primary conductor for interacting therewith to balun couple a field balanced between said first and second secondary conductors across said gap;
a second primary conductor on the topside of said substrate;
secondary conductor means on the bottomside of said substrate juxtaposed below said second primary conductor to interact therewith for balun field coupling; and
a diode pair mixer having only two diodes on the bottomside of said substrate isolated from said first and second primary conductors and interconnecting said first and second secondary conductors and said secondary conductor means for heterodyne modulation product signal generation one end of each diode of said diode pair being connected commonly to said secondary conductor means.

13. The invention according to claim 12 wherein said secondary conductor means comprises a dual balun having two pairs of balanced secondary conductors, the field between one pair applied across a first of said diodes and the field between the other pair applied across a second of said diodes.

14. The invention according to claim 13 wherein:
the first conductors in said pairs of balanced secondary conductors of said dual balun extend in spaced parallel relation from said ground plane means to a respective one of said first and second secondary conductors and are separated by the same said first mentioned gap;
the second conductors in said pairs of balanced secondary conductors of said dual balun extend in spaced parallel relation and are connected in common to a point between said diodes; and
said diodes are connected in series between said first and second secondary conductors.

15. The invention according to claim 14 wherein:
said first conductors in said pairs are collinear with said second conductors in said pairs and on opposite sides of said diode mixer; and
said first and second topside primary conductors are orthogonal to each other, with one conductor having a jumper section over and ohmically isolated from the other conductor.

16. The invention according to claim 15 wherein said second conductors in said pairs of balanced secondary conductors of said dual balun extend from their said common interconnection point and terminate proximate but gapped from said ground plane means and are connected to said ground plane means by bandpass capacitor filter means.

* * * * *